United States Patent [19]

Minch

[11] Patent Number: 5,309,457
[45] Date of Patent: May 3, 1994

[54] MICRO-HEATPIPE COOLED LASER DIODE ARRAY

[76] Inventor: Richard B. Minch, 15410 NE. 144th Pl., Woodinville, Wash. 98072

[21] Appl. No.: 994,651

[22] Filed: Dec. 22, 1992

[51] Int. Cl.⁵ .............................................. H01S 3/04
[52] U.S. Cl. ........................................ 372/34; 372/35; 372/69
[58] Field of Search ................ 372/18, 34, 35, 69, 372/75

[56] References Cited

U.S. PATENT DOCUMENTS

| | | | |
|---|---|---|---|
| 3,732,505 | 5/1973 | Freedman | 372/34 |
| 4,306,278 | 12/1981 | Fulton et al. | 362/259 |
| 4,393,393 | 7/1983 | Allen, Jr. et al. | 372/36 |
| 4,449,576 | 5/1984 | Baum et al. | 257/715 |
| 4,454,602 | 6/1984 | Smith | 372/36 |
| 4,716,568 | 12/1987 | Scifres et al. | 372/36 |
| 4,791,634 | 12/1988 | Miyake | 372/34 |
| 4,901,324 | 2/1990 | Martin | 372/36 |
| 5,105,429 | 4/1992 | Mundinger et al. | 372/34 |
| 5,105,430 | 4/1992 | Mundinger et al. | 372/35 |
| 5,223,747 | 6/1993 | Tschulena | 257/713 |

*Primary Examiner*—Frank Gonzalez

[57] ABSTRACT

A diode laser array made from a plurality of linear laser diode array assemblies affixed and in good thermal communication with bodies containing micro-heatpipes. Assemblies are stacked in a vertical manner to form two dimensional arrays. Each assembly is connected electrically and mechanically to adjacent assemblies to form the final assembly. In one embodiment the bodies are arranged in a vertical stairstep manner such that radiation from an upper assembly stimulates emission in adjacent lower assemblies thereby achieving frequency locking. In another embodiment said micro-heatpipe containing second bodies are fabricated from materials with a coefficient of thermal expansion closely matching with a coefficient of thermal expansion closely matching that of the laser diode array subassemblies. In another embodiment the assemblies form the evaporator of a second heatpipe device cooling means.

16 Claims, 10 Drawing Sheets

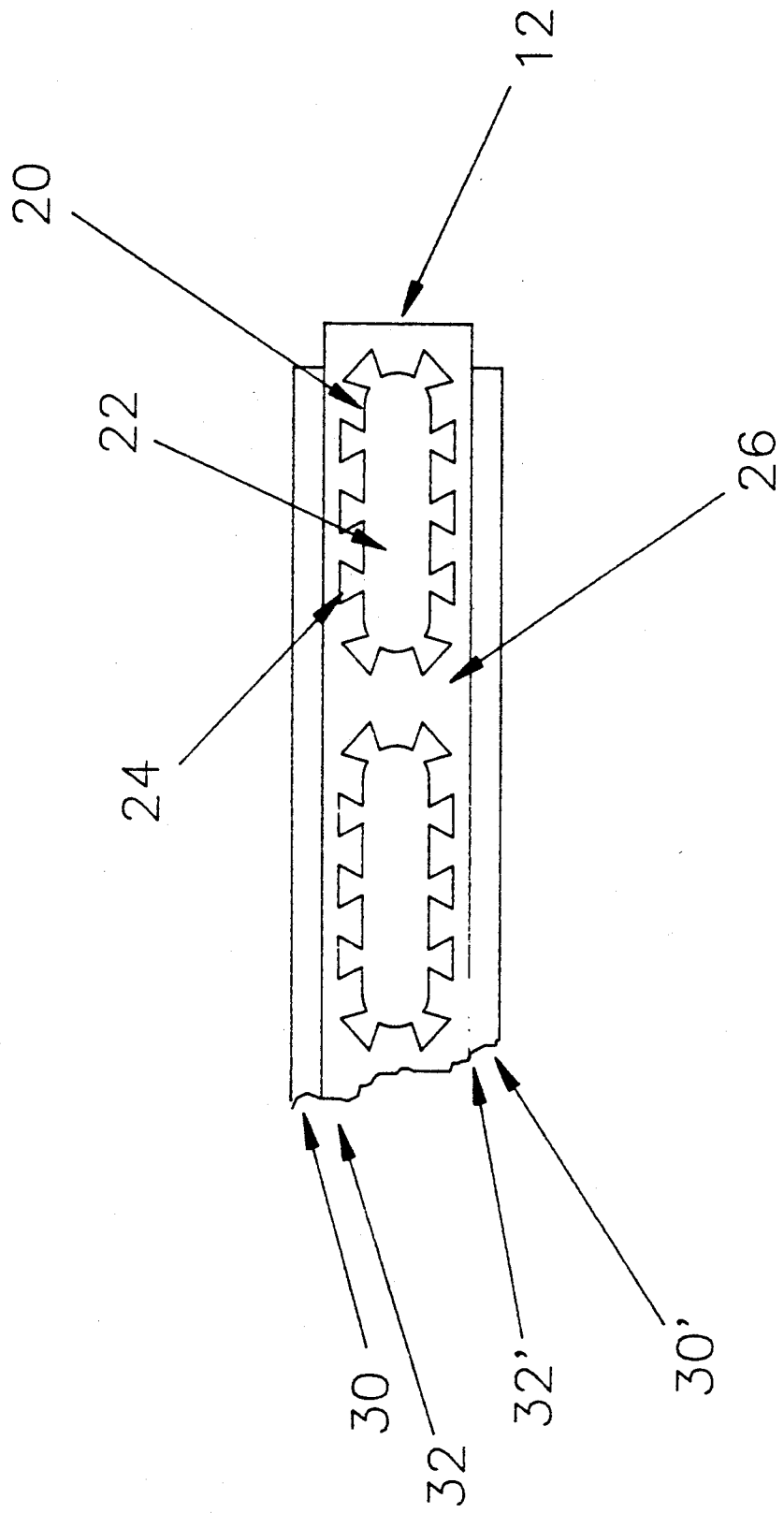
FIG. IA

MICRO-HEATPIPE COOLED LASER DIODE ARRAY

BACKGROUND OF THE INVENTION

The application of an electrical current to certain semiconductor diodes doped so as to contain a pn-junction produces electromagnetic radiation. The energy supplied is converted into the radiant energy emitted to the outside and into heat energy consumed in heating the device itself. One of the main heat sources is non-radiative recombination, i.e. the process in which the energy of the recombining electron-hole pair is transformed into phonons. Another heating effect is reabsorption of the radiation generated in the active region. These and other heating effects not only reduce the efficiency of the device but also, by increasing the temperature inside the device, adversely affect the properties of the emitted radiation beam thereby deteriorating the operating characteristics of the device. The parameters of the radiation beam such as the radiation power, the near-field and far-field patterns, and the spectral characteristics strongly depend upon the heat generation process and on the efficiency with which this heat is dissipated. In addition, the electrical characteristics of the device such as the current-voltage characteristic curve are negatively affected, the useable output power is degraded and reliability/lifetime is reduced by increases in the device junction temperature.

Multiple laser diodes are fabricated onto a single substrate into a linear laser diode array. To control the type and number of spatial modes the laser diode will emit, the electrical current and lasing emission are confined to a narrow stripe geometry. Multiple stripes are combined into a linear array, sometimes called a bar. In order to achieve high radiation intensity levels it is desirable to stack these bars into two dimensional arrays. This becomes important, for example, in the pumping of solid state lasers. In order to obtain high optical power levels, it is desirable to stack these linear diode array bars in close proximity into two dimensional array structures. Such structures, however, have to possess means for waste heat removal, mechanical integrity and electrical interconnection. The problem that this invention addresses is that of obtaining the maximum stacking density of linear laser diode array bars while at the same time removing sufficient waste heat such that the operation of the laser diodes is not adversely affected.

It is also desirable that the temperature along each bar be uniform so that each stripe of the bar can be operated phase locked. It is also desirable that the semiconductor bar and the heatsink onto which it is mounted have thermal coefficients of expansion which are closely matched to minimize thermal stress. Thermal stresses cause an undesirable shift in wavelength of the emitted radiation and can damage the linear laser diode array bar.

Among other applications, laser diodes provide a near ideal radiation source for pumping solid-state lasers. They combine very high brightness, high efficiency, monochromaticity and compact size. One of the most important problems in semiconductor laser design is realizing the potential of laser diodes and achieving maximum cw output power without locally overheating in the active regions.

Cooling techniques to avoid this problem have included forced air or liquid cooled radiators, micro-channel heat sinks through which cooling liquids are forced, copper heatsinks, diamond heatsinks, diamond coated copper heatsinks, silicon heatsinks, thermoelectric coolers, impingement coolers, cryogenic refrigerators and liquid nitrogen dewars. Examples of placing thermally conductive materials between laser diode bars in a two dimensional array can be found in U.S. Pat. Nos. 4,716,568 to Scifres and Harnagle, 4,454,602 to Smith and 4,393,393 to Allen. Each of these mounts a single laser diode array bar per heatsink due to the limited heat carrying capacity of the materials used. Other approaches separate the laser diodes so that they can be cooled individually and then attempt to combine their radiation via fiber optic bundles.

Each of these approaches has its limitations and none has been able to remove sufficient waste heat from between laser diode arrays to permit true CW (continuous) operation, although "quasi-CW" operation is often claimed, the term "quasi" meaning that the repetition rate is high enough to look continuous to the human eye. This thermal problem is the most serious problem facing the application of laser diode arrays to a wide variety of high-intensity applications.

These inventions are dependent upon using heatsink metals with a high thermal conductivity, e.g. copper and aluminium. Unfortunately, metals with a high thermal conductivity also have high thermal coefficients of expansion (CTE) relative to that of the laser diode substrate. This difference in CTE between substrate and heatsink results in thermal stresses which degrade the optical properties and induce damage into the laser diode substrate. What is required is a high thermal conductivity heatsink with a CTE closely matching the laser diode materials.

In U.S. Pat. No. 4,791,634 to Miyake heat is conducted away from between a two dimensional array of laser diode bars by interleaved heatsink strips, similar to those described under the patents referenced above, that conduct heat away from the laser diode array bars to the evaporator of a distant heatpipe, i.e. the laser diodes are not mounted directly onto the heatpipe.

Heatpipes are devices that are able to carry very large heatfluxes by utilizing the heat of vaporization of a fluid. A specified amount of the fluid is sealed within an elongated enclosure with the heat flux entering at one end, termed the evaporator, causing evaporation of the fluid. The resulting vapor phase travels the length of the enclosure and condenses on the cooler opposite end of the enclosure where the heat of condensation is removed to the outside. The liquid phase is returned to the evaporator end by capillary action via either arteries contained within the enclosure walls or via a fine mesh wick structure lining the walls of the enclosure.

Cotter's original proposal for micro-heatpipes involved simple channels formed by anisotropic etchants. Although others have subsequently improved upon Cotter's fabrication methodology, none have been able to fabricate the kinds of complex structures required to obtain good heat-transfer performance in sizes small enough to place between laser diode array bars. "Micro" was defined by Cotter to be a heat pipe so small that the mean curvature of the vapor-liquid interface is comparable in magnitude to the reciprocal of the hydraulic radius of the total flow channel. In practice, this translates into an enclosure with an internal vapor space channel with an approximate diameter of 100 to 500 micro-meters.

Although the concept of micro-heatpipes has been discussed in the literature and many attempts have been made to fabricate them, no one has been able to fabricate them with sufficiently small dimensions necessary to classify it as "micro" and with the cross-sectional design necessary to enable it to remove sufficient heat from between laser diode arrays to solve the problem described above. In fact, most if not all designs remain crude multi-sided channels in which the capillary pumping is done in the interstices, e.g. in the corners of triangles, squares or distorted squares.

These designs suffer from many limitations, the most serious being entrainment in which droplets of the unprotected liquid in the corners of the structure are ripped from the liquid surface and returned to the condenser end causing the evaporator end of the micro-heatpipe to dryout and fail. It is important to protect the liquid phase of the fluid by artery design, for example by protecting the artery with a re-entrant groove. This is difficult to do in a heatpipe that is small enough in diameter to be placed between two laser diode arrays so that high optical power levels are achieved.

DISCLOSURE OF THE INVENTION

One object of the present invention to provide a more effective means for removing heat from the active elements of a laser medium and transporting that heat to a remote dissipation means.

Another object is provide heat removing means and heat transportation means independent of any source of power.

Another object of the invention is to provide cooling means to improve the efficiency of a laser diode media by reducing the temperature in the active regions of the diode media, for example, by reducing the threshold current required for lasing action.

Another object is to provide a means to maintain the temperature within a device more uniform throughout to improve performance.

Another object of the present invention is to increase the optical radiation power per unit area of the two dimensional stacked laser diode array.

Another object of the invention is to provide means to lower the temperature of the active region of the laser devices so as to increase device reliability and lifetime.

Another object is to provide a compact heat removing means to allow close packing or stacking of laser diode media and thereby increasing the intensity of the available optical radiation per unit area of radiating surface.

Another object of the invention is to provide means for the reduction of thermal stresses in the laser diode media so as to improve their optical performance.

Another objective is to provide a means for frequency locking of a two dimensional array of linear laser diode array bars.

Another object is to teach the novel construction and operation of a micro-heatpipe that is a particularly useful means for removing heat from active devices like laser media.

These and other objects and advantages of the present invention will become apparent to those skilled in the art after considering the following detailed specification of preferred embodiments in conjunction with the accompanying drawings, wherein:

BRIEF DESCRIPTION OF THE DRAWINGS

FIG. 1a is an enlarged partial view of FIG. 1 showing a typical structure of the micro-heatpipes and the laser diode bars attached to each side of the body containing said micro-heatpipes.

FIG. 5a is an enlarged partial view of FIG. 5 showing a typical structure of the micro-heatpipes, liquid in the corners of said micro-heatpipes, and the laser diode bars attached to each side of the body containing said micro-heatpipes.

FIG. 7a is an enlarged partial view of FIG. 7 showing a typical structure of the micro-heatpipes and the laser diode bars attached to each side of the body containing said micro-heatpipes.

FIG. 8a is an enlargement of FIG. 8 showing the reflection of radiation from the surfaces of the said laser diode bars.

DESCRIPTION OF THE PREFERRED EMBODIMENTS

Figure 1:
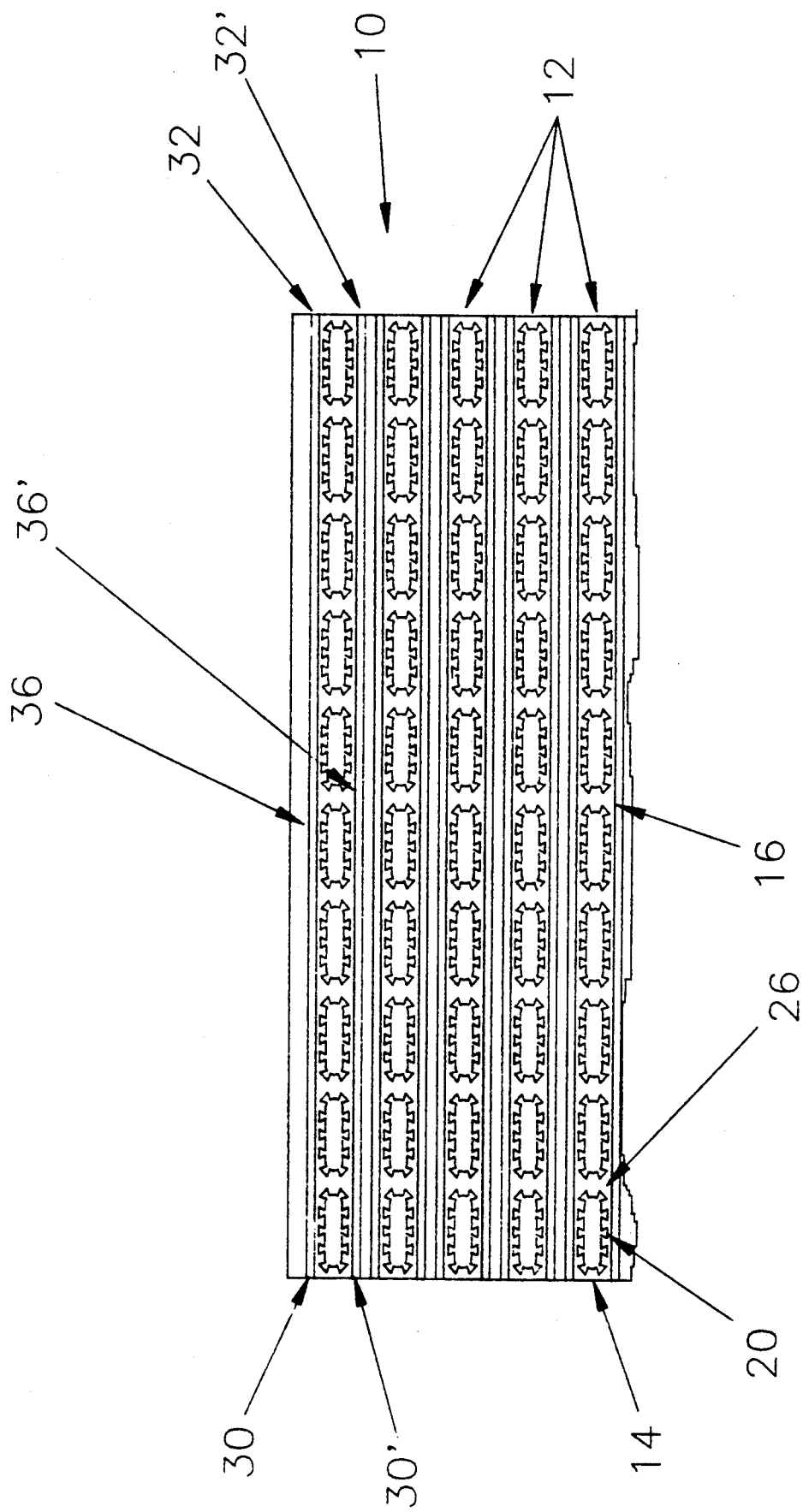
FIG. 1 is an elevation view, in transverse cross-section, of the end of a micro-heatpipe cooled laser diode array showing multiple said bodies each containing a plurality of micro heatpipes with a laser array bar attached to each side of said bodies.

FIG. 1 shows a cross-section of the first embodiment of the micro-heat pipe cool laser diode array 10 according to the present invention which has a micro-heatpipe body 12 of rectangular parallelpiped exterior shape having a cross-sectional shape comprising a small dimension 14 and a long dimension 16. Said body 12 has multiple micro-heatpipe cavities 20 located within its interior, said cavities 20 running normal to the plane defined by dimensions 14 and 16 and parallel to each other separated by a solid integral solid members 26. FIG. 1 shows laser diode array bars 30 and 30' are affixed with high-thermal conductivity bonding layers 32 and 32' to said micro-heatpipe body 12 with the long dimensions 36 and 36' of the laser diode array bars parallel to the long dimension 16 of the micro-heat pipe body 12.

Said micro-heatpipe bodies can be fabricated by first producing a preform consisting of a shaped wire of with cross-sectional shape of the cavities 20, by ordinary wire drawing techniques, then embedding it into a second material of major dimensions 14 and 16 by casting, vapor deposition or plasma deposition methods. Powder compaction around the shaped wire preform followed by infiltration casting can also be used. These processes can be supplimented by surface grinding or polishing as required. The first material is then removed by chemical means leaving the cavity 20 with a central vapor space area 22 surrounded by arteries 24. A practitioner in metal fabrication could use other processes to form micro-heatpipe bodies around a shaped wire preform which would be within the intent and spirit of this invention.

Figure 2:
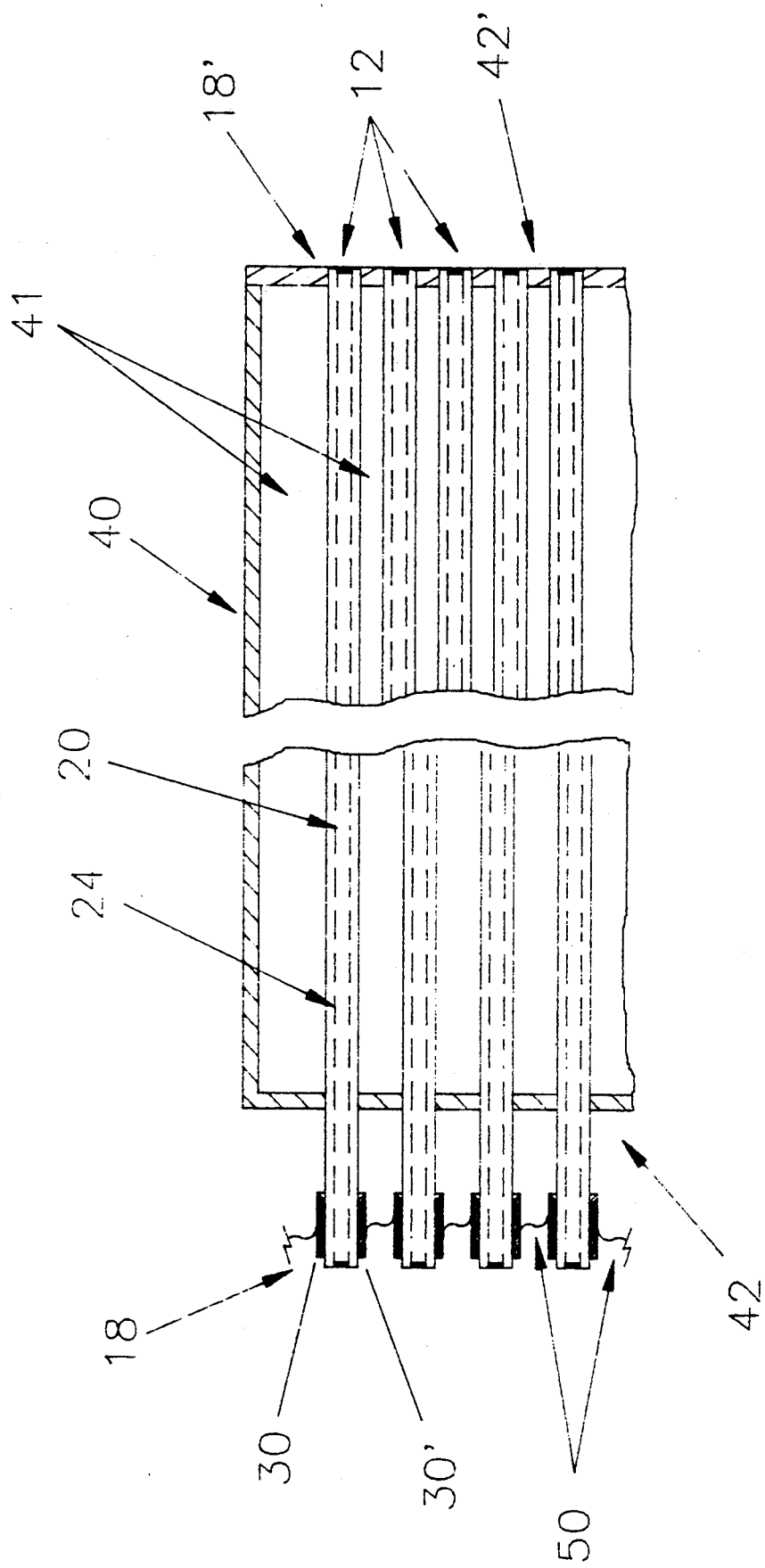
FIG. 2 is an elevation view, in longitudinal cross-section, showing micro-heatpipe containing bodies, each with two laser diode bars attached to opposite sides of one end, extending into an enclosure with provision for a cooling fluid to pass over said bodies.

Said micro-heatpipe cavities are hermetically sealed at ends 18 and 18', as shown in FIG. 2, end 18 adjacent to a relatively high- temperature evaporator end section and end 18' adjacent to a relatively low-temperature condensing end section between which thermal energy is transferred, said micro-heatpipe cavity comprising a longitudinal vapor channel 22 as enlarged in FIG. 1a and at least one longitudinal liquid channels 24, also called arteries, extending the length of the said micro-heatpipe cavity. Said arteries 24 are separate from one another and have a side by side relationship with their longitudinal axes being substantial parallel and containing a cross-sectional shape with capillary pumping and flow means extending their length, thereby providing a fluid communication means between the evaporator and condenser ends of the micro-heatpipe cavity. Arteries 24 are shown as trapazoidal, but a practitioner in the art would be able to modify this shape to produce capillary pumping of the liquid phase of the enclosed fluid. The narrow base dimension of the trapazoid adjacent to the vapor space serving as a re-entrant groove and protecting the liquid phase within the groove from the high velocity vapor, that is preventing entrainment wherein droplets of liquid are torn from the liquid surface and returned to the condenser end thereby causing the evaporator to dryout and the micro-heatpipe to fail. Other re-entrant groove designs, which would fall within the spirit of this invention, could be designed by a practitioner in the art. The operating temperature range of a micro-heatpipe depends in part upon the fluid used, with water, ethanol and ammonia having properties appropriate to the desired operating temperature range of laser diodes. A practitioner skilled in heatpipe technology could find other fluids, but these would fall within the spirit and intent of this invention.

The fluid contained in cavity 20 is of a predetermined amount having a liquid phase and a vapor phase at the operating temperature of the device with the fluid evaporating in the high temperature evaporator section adjacent to end 18 and condensing in the relatively lower temperature condenser section adjacent to end 18' such that heat is transferred between said evaporator section and condenser section by phase change of the said fluid wherein said vapor phase flows along the vapor channel 22 from the evaporator section to the condenser section and said liquid phase flows from the condenser section to the evaporator section in said arteries 24. Procedures for measuring, loading and sealing of fluid into heatpipes are well known to those skilled in the art; see, for example, Peterson.

FIG. 2 shows a longitudinal cross-section of the another embodiment of the invention. Two Laser diode array bars 30 and 30' are affixed one on each side of one end 18 of the longitudinal dimension of a single micro-heatpipe body 12. The 2*N laser diode array bars 30, 30'..30$^{2*N}$ are electrically connected in series with N interconnecting wires 50, 50'..50$^N$ forming electrical connections between the N bodies 12, the connection between the laser diode array bars affixed to the same body 12 being through the metallic body 12 itself. The multiple arteries 24 being loaded with a working fluid and both ends 18 and 18' being sealed such that the central cavities 20 are completely enclosed from the outside. N bodies 12, each with two laser diode array bars 30 and 30' attached, where N is any number greater than one, are stacked in close proximity, but not touching one another, passing through and being held in place by an electrical insulative material 42 which forms one side of an enclosure 40, the N bodies 12 passing through the said enclosure 40 and being affixed in the end 42' also fabricated from an electrical insulative material. A dielectric fluid flows normal to FIG. 2 through interstices 41, passing between said N bodies 12, said flow being contained by enclosure 40. Cooling can be by convection or boiling.

Arteries 24 are of a size and shape such that capillary action of the enclosed fluid occurs in its cross-section and serves to move said dielectric fluid from the end 18' back to end 18 where it is re-evaporated. A practitioner in the art would be able to alter the depicted structure of cavities 20 and the shape of the central vapor space 22 and arteries 24 are only representative of micro-heat pipe structures.

Figure 3:
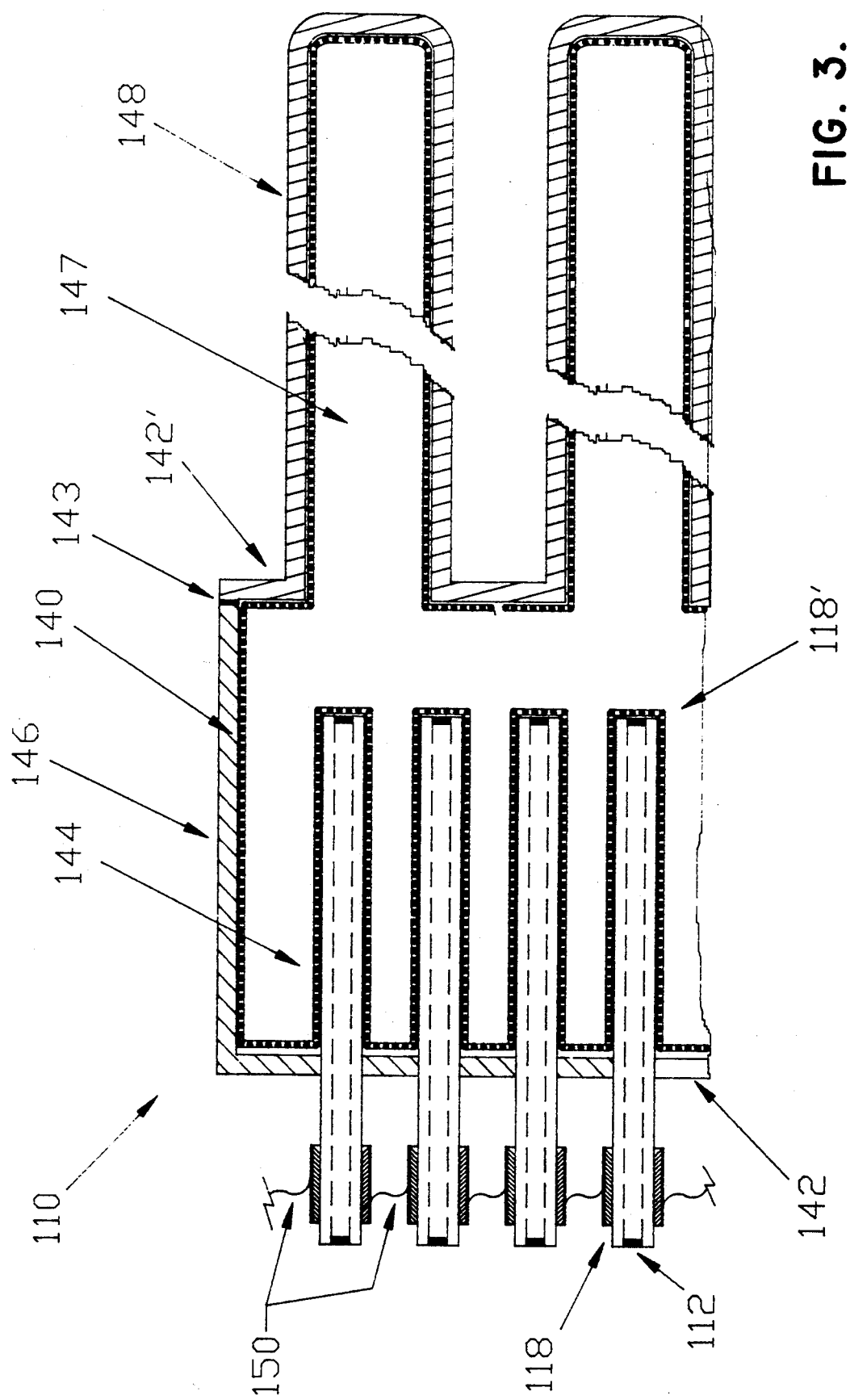
FIG. 3 is an elevation view, in longitudinal cross-section, showing micro-heatpipe containing bodies, each with two laser diode bars attached to opposite sides of one end, with said bodies extending into an enclosure and forming the evaporator for a second heat-pipe.

Another embodiment of the invention is shown in FIG. 3 in which N bodies 112 enter the enclosure 140 through the electrically insulative wall 142 with said bodies 112 extending a portion of the length of the enclosure 140. Said bodies 112 contain internal cavities 20, central vapor space 22 and arteries 24 as shown in FIG. 1a. Said bodies 112 are electrically interconnected with N wires 150. The portions of bodies 112 extending into enclosure 140 are covered by fine mesh 144 which extends along wall 142 to all four sides 146 of enclosure 140 to end 142' and fins 148. The walls 146 are made of an electrically insulative material. End 142' is a metallic material, joined to body 140 with a bonding agent 143, containing internal channels 147 lined with mesh 144, the exterior of said channels forming fins 148. A dielectric fluid is placed into enclosure 140, before it is sealed at ends 118 and 118', and acts to remove heat from the multiple bodies 112 by evaporation with the resulting vapor condensing onto the surfaces of the end 142' where the heat exits to the exterior through fins 148 with said dielectric fluid returning to bodies 112 via capillary action through the contiguous fine mesh 144.

Figure 4:
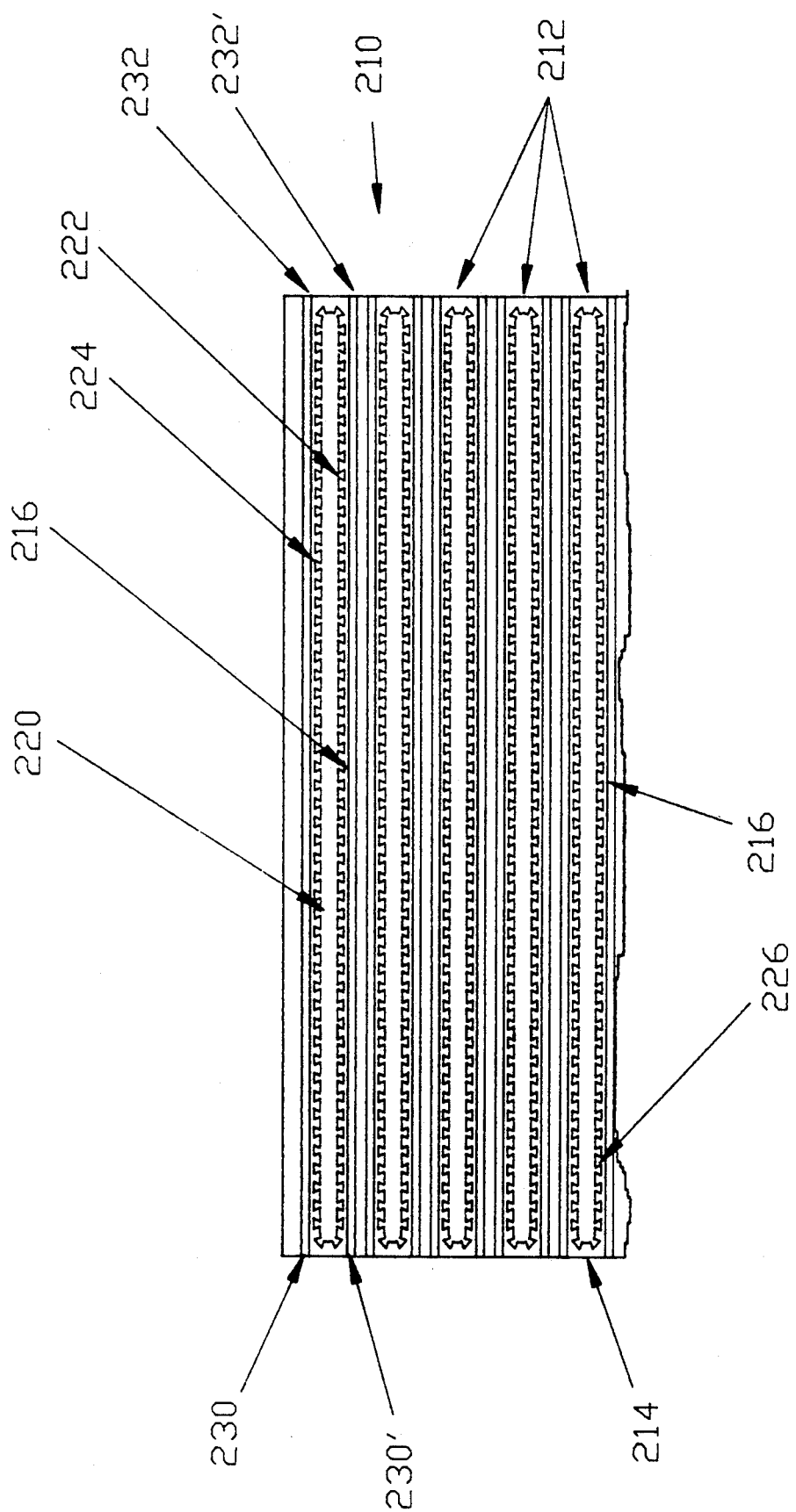
FIG. 4 is an elevation view, in transverse cross-section, of the end of a micro-heatpipe cooled laser diode array showing multiple said bodies each containing a single micro-heatpipe with a laser diode a bar attached to each side of said bodies.

FIG. 4 shows the cross-section of another embodiment of the invention in which the assembly 210 contains multiple micro-heatpipe bodies 212 each containing a single cavity 220 running normal to the plane formed by dimensions 214 and 216. Said cavity 220 comprising a single central vapor space 222 surround by multiple arteries 224. Said bodies 212 have laser diode array bars 230 mounted on either one side parallel to direction 216 or on both sides 230 and 230'. The said laser diode array bars are attached with a high-thermal conductivity bonding agent 232 for a single said laser diode array bar or 232 and 232' for two bars 230 and 230'. The arteries are only representative and a practitioner in the art could devise other shapes.

Figure 5:
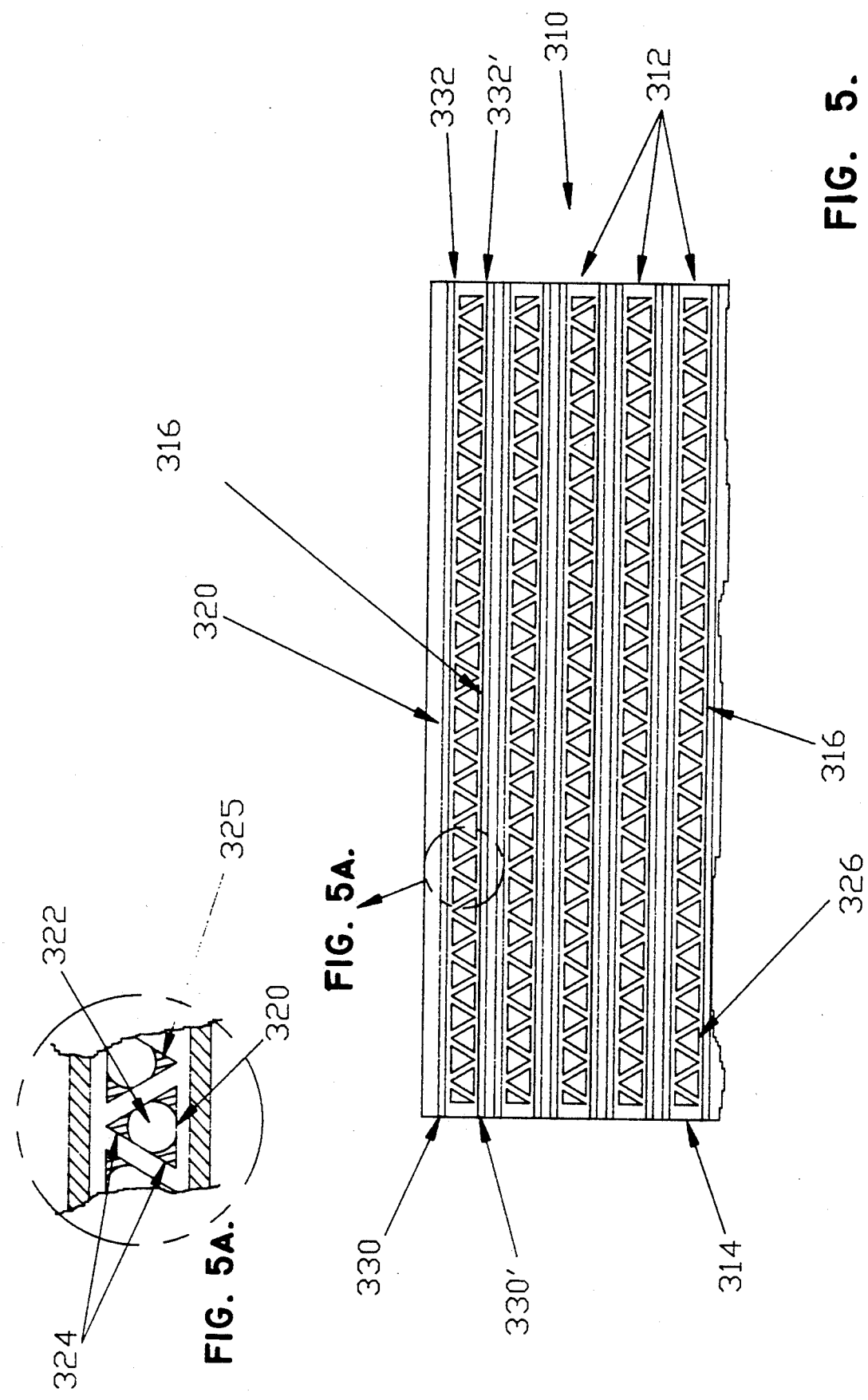
FIG. 5 is an elevation view, in transverse cross-section, of the end view of a micro-heatpipe cooled laser diode array showing multiple said bodies each containing a plurality of micro-heatpipes with a laser diode array bar attached to each side of said bodies.

FIG. 5 is the cross-section of another embodiment of the invention in which an assembly 310 has multiple micro-heatpipe bodies 312 in which multiple cavities 320 run normal to the plane formed by dimensions 314 and 316. FIG. 5a shows an enlargement of one of the cavities 320 in which the interstices of the corners 324 serve as arteries to pump the fluid 325 enclosed in the interstices by capillary action and the central portion of cavity 320 depicted by the area 322 serves as the vapor return space. Laser diode array bars 330 and 33040 are attached to either one or both sides with high-thermal conductivity bonding agent 332 and 332'. A practitioner in the art would be able to alter the depicted structure to permit other arrangements of interstices and vapor space by creating other geometric shapes.

Figure 6:
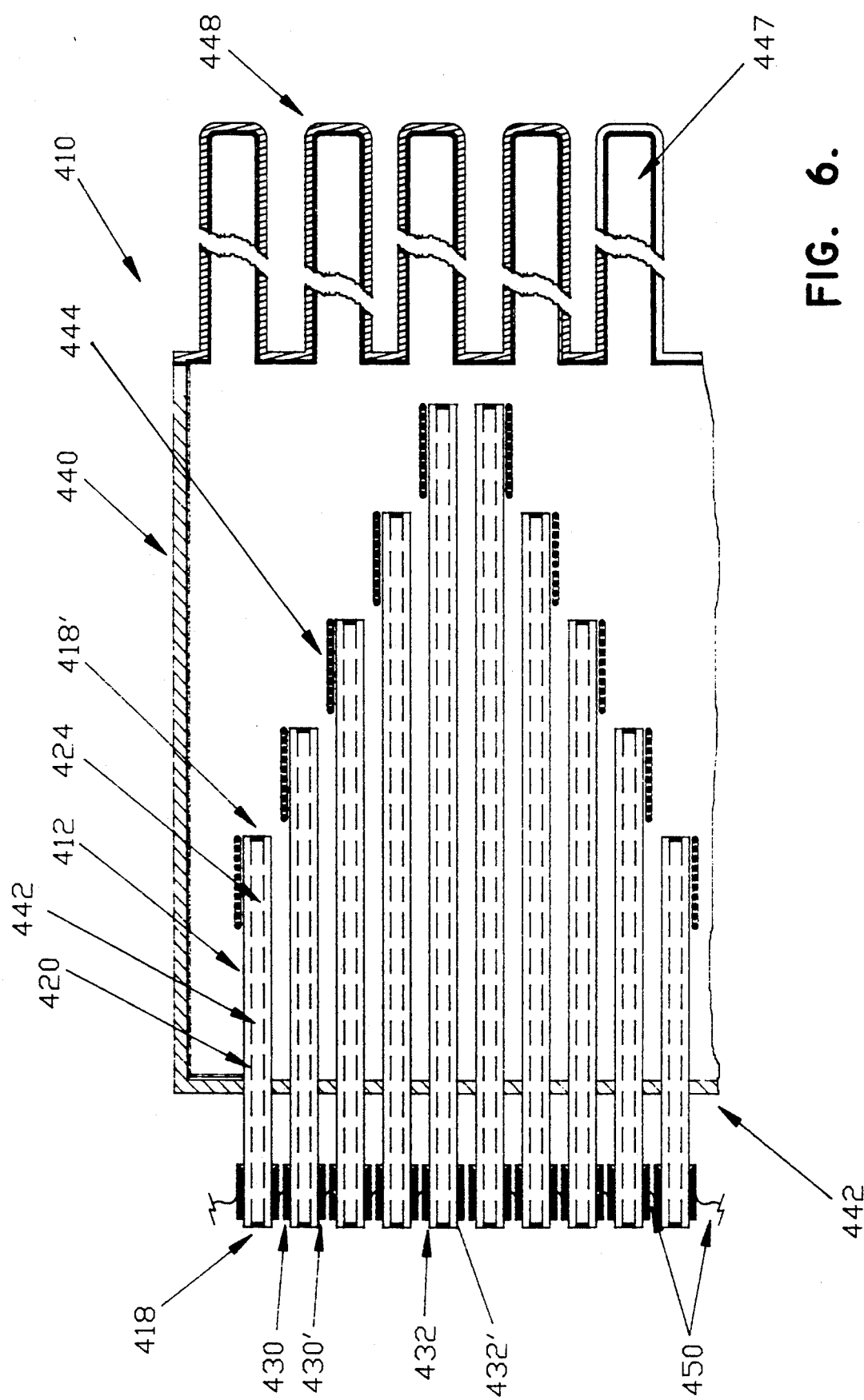
FIG. 6 is an elevation view, in longitudinal cross-section, showing micro-heatpipe containing bodies, each with two laser diode bars attached to opposite sides of one end, with said bodies extending multiple distances into an enclosure, to allow close packing, and forming the evaporator for a second heat-pipe.

The longitudinal cross-section of an assembly 410 representing another embodiment of the invention is shown in FIG. 6 wherein N bodies 412 containing single or multiple parallel micro-heatpipe cavities 20 as shown in FIG. 1 and FIG. 4 respectively, each said cavity containing a central vapor space 22 surrounded by multiple arteries 24. Said cavities 20 contain a predetermined amount fluid, are sealed at ends 418 and 418' and operate as micro-heatpipes as described earlier. Linear laser diode array bars 430 and 430' are affixed to one or both sides of said bodies with a bonding agent of good thermal conductivity. Said multiple bodies 412 extend through an insulative wall 442 into a sealed enclosure 440 the length of each of the N bodies 412 differing from its nearest neighbors by the length of wire mesh 444 which forms a contiguous path with the wire mesh covering the interior of enclosure 440 and extending to channels 447 formed within the end wall 448 of enclosure 440, wherein heat is passed from the end of the said micro-heatpipe bodies to the then channels 447 by vapor flow and then to the outside fins 448 by conduction. Laser diode arrays 430 and 430' are attached to either one or both sides of said micro-heatpipe bodies 412 at end 418 with a high-thermal conductivity bonding agent 432 and 432'. A practitioner in the art could arrange other staggered arrangements which would give each wire mesh pad 444 access to the interior of enclosure 440 without being blocked by its nearest neighbors.

Figure 7:
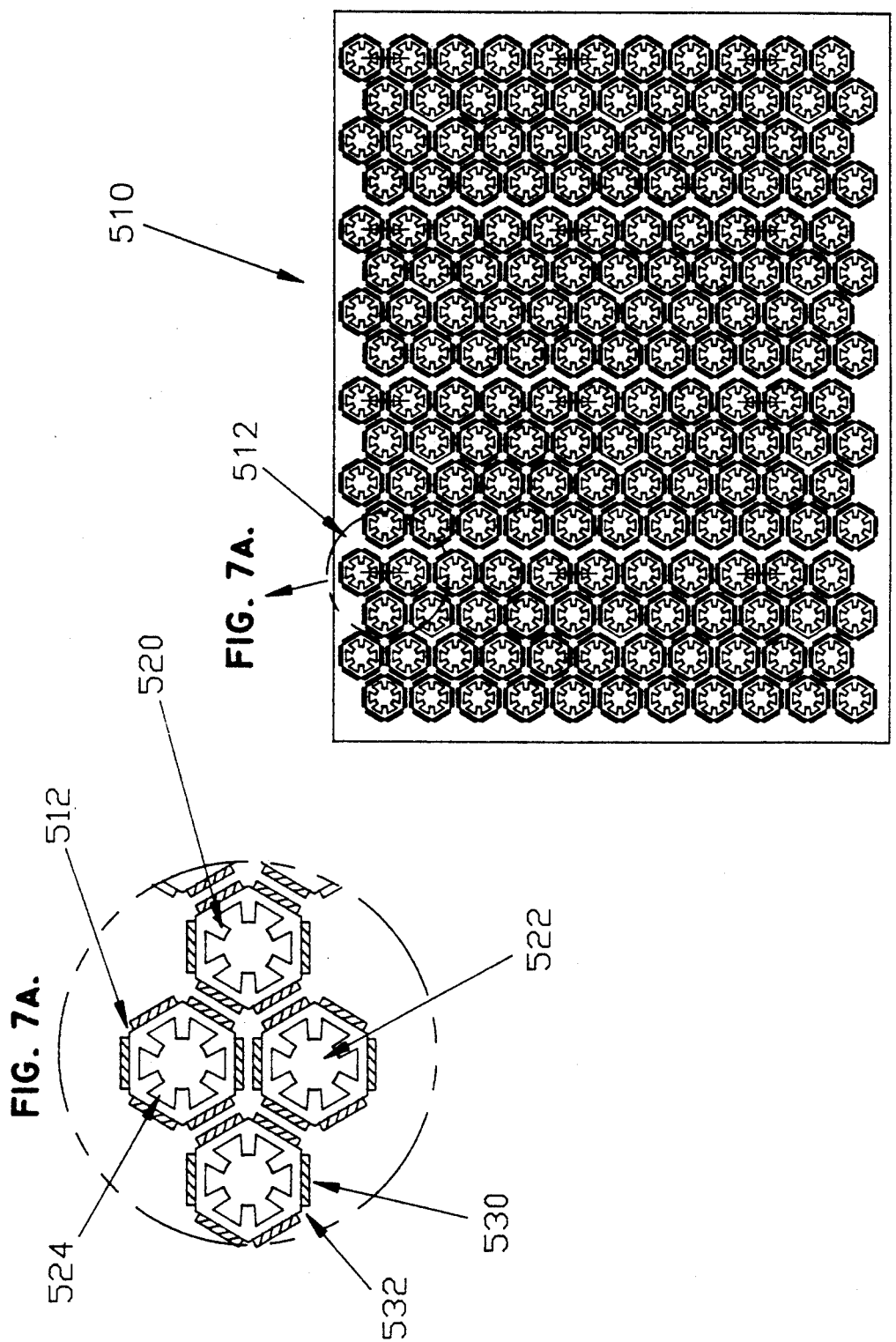
FIG. 7 is an elevation view, in transverse cross-section, of the end of a micro-heatpipe cooled laser diode array showing multiple said bodies, each containing a single micro-heatpipe with laser diode bars attached to each side of said bodies.

The cross-section of another embodiment 510 of the invention is shown in FIG. 7. An enlargement is shown in FIG. 7a wherein a hexagonal body 512 contains a cavity 520 running along its major axis, said cavity 520 being comprised of a central vapor space 522 surrounded by multiple arteries 524. Processes described previously could also be used to fabricate this embodiment of the invention. Laser diode bars 530 are affixed to one or several exterior surface with a thermally conductive bonding layer 532. Bonding layers typically are low melting point metals and alloys, e.g. indium. Prior to bonding, the micro-heatpipe may be sputter coated with a thin gold layer. An electrical means for connecting the said laser diode bars in series is provided similar to that shown in FIG. 8. The cross-sections of multiple bodies 512 are arranged in a close-packed array as shown in FIG. 7.

Figure 8:
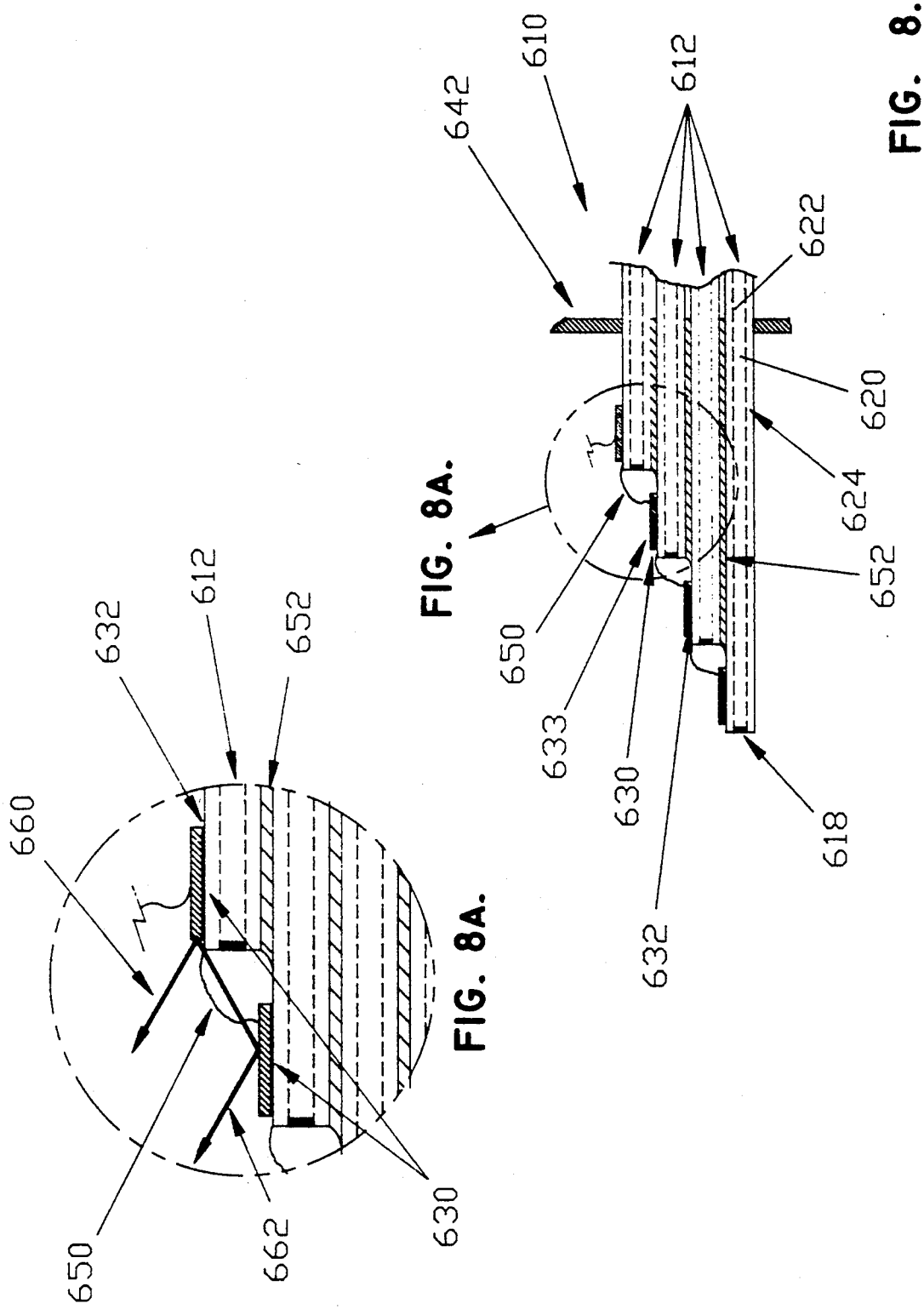
FIG. 8 is an elevation view, in longitudinal cross-section, with a single laser diode bar attached to micro-heatpipe containing body and said bodies stacked in a stair step manner.
Figure 9:
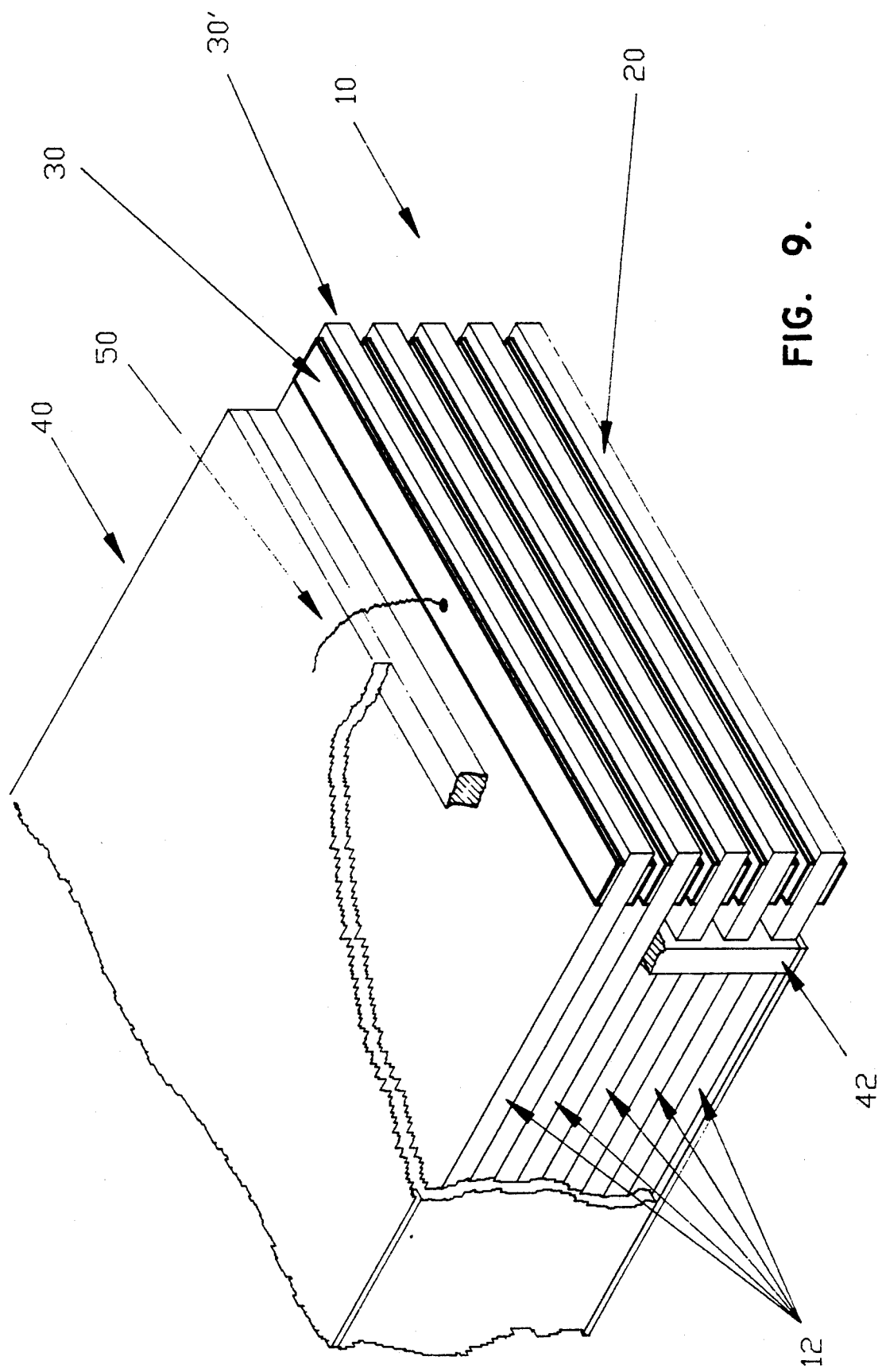
FIG. 9 is a cutaway isometric view of one embodiment of the present invention.

FIG. 8 shows a longitudinal cross-section of another embodiment of the invention wherein N bodies 612 containing single or multiple cavities 620, each said cavity containing a central vapor space 622 surrounded by arteries 624. Said cavities 620 contain measured amount of a fluid and are sealed at ends 618 and 618'. A linear laser diode array bar 630 is affixed to each said body with a high thermal conductivity bonding layer 632 forming an assembly. Said multiple assemblies are stacked in a stairstep fashion separated by an insulative layer 652. Said linear laser diode array bars are connected in electrical series with the circuit comprising multiple connecting wires 650, the linear laser diode array bars and the said bodies 612. Said asssemblies are insulated from each other by insulative layer 652 and stacked in a stairstep manner. Said insulation 652 can be an insulative material such as Mylar, $Al_2O_3$, BeO or $SiO_2$. Insulative material can also be the oxide of the body 612, e.g. $Ta_2O_5$. Said assemblies pass through and are held in place by mechanical means provided by wall 642. As shown in FIG. 8a, the optical radiation from the linear laser diode array bars highest in the vertical array of said assemblies provides stimulus radiation 662 to those below . Said stimulative radiation causing laser diodes in said lower linear laser diode array bars to oscillate at the same frequency. This relationship being replicated between remaining said multiple assemblies with an upper and lower stacking relationship. A remaining portion of said radiation being reflected from mirror surfaces 633 located on the top portion of It is apparent, from what has been described, that many combinations, arrangements and variations of the components can be made without departing from the spirit and scope of the invention. For example, the micro-heatpipe bodies could be fabricated from alloys of tantalum, niobium or other alloys which have a CTE closely matching the laser diode substrate material.

Thus there has been shown and described a novel heat transfer means for cooling and transferring heat from the active elements of laser diode devices, which means fulfill all of the objectives and advantages sought therefore. It will be apparent, to those skilled in the art, that many changes, variations, modifications, and other uses and applications of the subject device are possible and contemplated, and all such changes, variations, modifications, and other uses and applications which do not depart from the spirit and scope of the invention are deemed to be covered by the invention which is limited only the claims which follow:

What I claim is:

1. A micro-heatpipe cooled laser diode array assembly comprising:
   (a) a plurality of bodies each containing micro-heatpipe means for heat transfer;
   (b) an assembly comprising a single laser diode array bar affixed with means providing good thermal contact to principal surfaces of said bodies;
   (c) multiple said assemblies held with a mechanical means for holding said assemblies in a stair-step stacking manner and with electrical means for providing electrical energy to said assemblies, whereby a portion or all of the end of said micro-heatpipe bodies are hidden behind the said laser diode array bars thereby increasing the percentage of the surface normal to the radiation direction emitting radiation.

2. The assembly of claim 1 wherein cooling means are provided for the ends of said bodies not attached to said laser diode array bars, wherein the heat transported away from the said laser diode array bars via said micro-heatpipe bodies is subsequently removed from the said micro-heat pipe bodies.

3. The assembly of claim 1 wherein mounting means of said multiple assemblies are provided by passing said assemblies through wall of a sealed enclosure containing a dielectric fluid and capillary means for returning said fluid from all parts of said enclosure to said multiple assemblies; whereby said fluid is evaporated at multiple said assemblies with resulting vapor phase of said fluid passing to other parts of said enclosure and condensing with released heat being passed through said enclosure walls to the exterior and the condensed liquid phase of said fluid being returned to said assemblies by capillary action for re-evaporation.

4. The assembly of claim 1 wherein mounting means of multiple assemblies are provided by passing said assemblies through wall of an enclosure with an entrance and an exit with means for passing a dielectric fluid over said multiple assemblies, wherein said assembly is cooled by convection.

5. The assembly of claim 1 wherein the said bodies are fabricated from a material with a coefficient of thermal expansion which selected to closely match the coefficient of thermal expansion of the said linear diode array bars mounted thereon.

6. A micro-heatpipe cooled laser diode array assembly comprising:
 (a) a plurality of bodies each said body comprising a single or a plurality of micro-heatpipe(s) each said micro-heatpipe having an elongated closed chamber extending within said body from said first end to said second end within which said chamber is contained a specified amount of a fluid which circulates as vapor in a central vapor space portion of the cross-section of said chamber with said fluid evaporation from said first end and passing to said second end as vapor condensing at said second end and returning to said first end in its liquid phase via one or a plurality of artery chambers each of which is in fluidic communication with said vapor space portion of the cross-section of said chamber thereby forming a closed system for the transfer of the heat of evaporation of said fluid from the said first end to the said second end, micro-heatpipe cooled laser diode array further comprising:
 (b) one or a plurality of laser diode bars being affixed with means providing good thermal contact to the principal surfaces of said bodies at said first end and oriented such that said micro-heatpipe(s) pass in close proximity to said laser diode bars and parallel the their principal plane;
 (c) multiple said assemblies being held with a mechanical mounting means in a stacking manner such that said bodies each containing one or multiple said micro-heal pipes pass between adjacent said assemblies, whereby two-phase heat transfer is effected from the volume located between adjacent said laser diode bars;
 (d) each said assembly provided with electrical means for providing electrical energy to said laser diode bars.

7. The assembly of claim 6 additionally comprising a convective or boiling cooling means for removing heat from the said second end of the plurality of micro-heatpipes, wherein said second end extends into an enclosure, said enclosure having a first and second opening through which a coolant flows.

8. A micro-heatpipe cooled laser diode array assembly wherein said micro-he atpipes pass between said laser diodes for cooling, said assembly comprising:
 (a) plurality of bodies each containing single or multiple micro-heatpipe means for heat transfer;
 (b) assemblies each of which comprises one or more linear laser diode array bars affixed with means providing good thermal contact to the principal surfaces of said bodies;
 (c) multiple said assemblies held with a mechanical mounting means in a stacking manner by passing said assemblies through the wall of a sealed enclosure containing a specified amount of fluid and a capillary means for returning said fluid from all parts of said enclosure to said multiple assemblies; whereby said fluid is evaporated at multiple said assemblies with resulting vapor phase of said fluid passing to other parts of said enclosure and condensing with released heat being passed through said enclosure walls to the exterior and the condensed liquid phase of said fluid being returned to said assemblies by capillary action for re-evaporation.
 (d) multiple said assemblies provided with electrical means for providing electrical energy to said assemblies.

9. A micro-heatpipe cooled laser diode array assembly wherein said micro-heatpipes pass between said laser diodes for cooling, said assembly comprising:
 (a) plurality of bodies each containing single or multiple micro-heatpipe means for heat transfer;
 (b) assemblies each of which comprises one or more linear laser diode array bars affixed with means providing good thermal contact to the principal surfaces of said bodies;
 (c) mechanical mounting means of said multiple assemblies are provided by passing said assemblies through the wall of an enclosure with an entrance and an exit with means for passing a dielectric fluid through said enclosure and over said multiple assemblies, wherein said assemblies are cooled by convection or boiling;
 (d) multiple said assemblies provided with electrical means for providing electrical energy to said assemblies.

10. The assembly of claim 9 wherein the said bodies are fabricated from a material with a coefficient of thermal expansion which is selected to closely match the coefficient of thermal expansion of the said linear laser diode bars mounted thereon.

11. A micro-heatpipe cooled laser diode array comprising:
 (a) a plurality of assemblies each said assembly comprising a body with a first end and a second end with each said assembly further comprising single or multiple laser diode bars attached to said first end of said body with a mechanical means having good thermal conductivity;
 (b) each said body further comprising a single or a plurality of micro-heatpipe(s) each said micro-heatpipe having an elongated closed chamber extending within said body from said first end to said second end within which said chamber is contained a specified amount of a fluid which circulates as vapor in a central vapor space portion of the cross-section of said chamber with said fluid evaporation from said first end and passing to said second end as vapor condensing at said second end and returning to said first end in its liquid phase via one or a plurality of artery chambers each of which is in fluidic communication with said vapor space portion of the cross-section of said chamber thereby forming a closed system for the transfer of the heat of evaporation of said fluid from the said first end to the said second end;

(c) multiple said assemblies being held in a two dimensional close packed arrangement with the principal axis of each said assembly parallel with the principal axis of every other said assembly and with all said first ends grouped together and all said second ends grouped together;

(d) each said assembly being provided with electrical means for providing electrical energy to said assemblies.

12. The micro-heatpipe cooled laser diode array of claim 11 additionally comprising a cooling means for removing hat from the said second end of the said plurality of assemblies.

13. The micro-heatpipe cooled laser diode array of claim 11 wherein mechanical mounting means of said multiple assemblies are provided by passing said assemblies through the wall of a sealed enclosure containing a dielectric fluid and capillary means for returning said fluid from all parts of said enclosure to said multiple assemblies whereby said fluid is evaporated at said multiple assemblies with resulting vapor phase of said fluid passing to other parts of said enclosure and condensing with release heat of condensation of said fluid being passes through said enclosure walls to the exterior and condensed liquid phase of said fluid being returned to said multiple assemblies by said capillary means for re-evaporation.

14. The micro-heatpipe cooled laser diode array of claim 11, wherein mechanical mounting means of multiple assemblies are provided by passing said assemblies through the wall of an enclosure with said enclosure further comprising an entrance opening and an exit opening with means for passing a dielectric fluid into said enclosure through said entrance opening said dielectric fluid passing over said second ends of said assemblies and exiting enclosure through said exit opening, whereby said multiple assemblies are cooled by convection or boiling.

15. The micro-heatpipe cooled laser diode array of claim 11 wherein a portion of the radiation from the upper said assemblies stimulates radiative emission from one or more said assemblies located in a lower vertical relationship, whereby frequency locking of the micro-heatpipe cooled laser diode array is obtained.

16. The micro-heatpipe cooled laser diode array of claim 11 wherein the said bodies are fabricated from a material with a coefficient of thermal expansion which is selected to closely match the coefficient of thermal expansion of the said laser diode array bars mounted thereon.

* * * * *